United States Patent
Kuo

(10) Patent No.: US 9,117,804 B2
(45) Date of Patent: Aug. 25, 2015

(54) INTERPOSER STRUCTURE AND MANUFACTURING METHOD THEREOF

(71) Applicant: UNITED MICROELECTRONICS CORPORATION, Hsinchu (TW)

(72) Inventor: Chien-Li Kuo, Hsinchu (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 35 days.

(21) Appl. No.: 14/025,843

(22) Filed: Sep. 13, 2013

(65) Prior Publication Data

US 2015/0076694 A1    Mar. 19, 2015

(51) Int. Cl.
| | | |
|---|---|---|
| *H01L 29/40* | (2006.01) | |
| *H01L 21/44* | (2006.01) | |
| *H01L 21/48* | (2006.01) | |
| *H01L 23/14* | (2006.01) | |
| *H01L 23/498* | (2006.01) | |
| H01L 23/532 | (2006.01) | |
| H01L 23/525 | (2006.01) | |

(52) U.S. Cl.
CPC ............ *H01L 21/486* (2013.01); *H01L 23/147* (2013.01); *H01L 23/49827* (2013.01); *H01L 23/525* (2013.01); *H01L 23/53238* (2013.01)

(58) Field of Classification Search
CPC ............... H01L 2224/05546; H01L 21/76807
USPC ........................... 257/773–776; 438/675, 702
See application file for complete search history.

(56) References Cited

U.S. PATENT DOCUMENTS

| | | |
|---|---|---|
| 3,150,299 A | 9/1964 | Noyce |
| 3,256,465 A | 6/1966 | Weissenstem |
| 3,323,198 A | 6/1967 | Shortes |
| 3,343,256 A | 9/1967 | Smith |
| 3,372,070 A | 3/1968 | Zuk |
| 3,462,650 A | 8/1969 | Hennings |
| 3,648,131 A | 3/1972 | Stuby |
| 4,394,712 A | 7/1983 | Anthony |
| 4,395,302 A | 7/1983 | Courduvelis |
| 4,616,247 A | 10/1986 | Chang |
| 4,773,972 A | 9/1988 | Mikkor |
| 4,939,568 A | 7/1990 | Kato |
| 5,173,442 A * | 12/1992 | Carey .............................. 216/18 |
| 5,214,000 A | 5/1993 | Chazan |
| 5,229,647 A | 7/1993 | Gnadinger |
| 5,286,926 A | 2/1994 | Kimura |
| 5,372,969 A | 12/1994 | Moslehi |
| 5,399,898 A | 3/1995 | Rostoker |
| 5,463,246 A | 10/1995 | Matsunami |
| 5,484,073 A | 1/1996 | Erickson |
| 5,502,333 A | 3/1996 | Bertin |

(Continued)

*Primary Examiner* — Calvin Lee
(74) *Attorney, Agent, or Firm* — Ding Yu Tan

(57) ABSTRACT

An interposer structure including a semiconductor substrate, a plurality of shallow trenches, a plurality of deep trenches and a plurality of metal damascene structures is provided. The semiconductor substrate has a first surface and a second surface opposite to each other. The shallow trenches are formed on the first surface in both of a first area and a second area of the semiconductor substrate and correspondingly a plurality of respective openings are formed on the first surface. The deep trenches extend from at least one of the shallow trenches toward the second surface in the second area and correspondingly a plurality of respective openings are formed on the second surface. The metal damascene structures are filled in both of the shallow trenches and the deep trenches. A manufacturing method for the aforementioned interposer structure is also provided.

5 Claims, 3 Drawing Sheets

(56) References Cited

U.S. PATENT DOCUMENTS

| | | | |
|---|---|---|---|
| 5,627,106 A | 5/1997 | Hsu | |
| 5,702,982 A * | 12/1997 | Lee et al. | 438/620 |
| 5,793,115 A | 8/1998 | Zavracky | |
| 5,977,640 A | 11/1999 | Bertin | |
| 6,018,196 A | 1/2000 | Noddin | |
| 6,143,616 A | 11/2000 | Geusic | |
| 6,274,937 B1 | 8/2001 | Ahn | |
| 6,309,956 B1 | 10/2001 | Chiang | |
| 6,391,777 B1 | 5/2002 | Chen | |
| 6,407,002 B1 | 6/2002 | Lin | |
| 6,440,640 B1 | 8/2002 | Yang | |
| 6,483,147 B1 | 11/2002 | Lin | |
| 6,525,419 B1 | 2/2003 | Deeter | |
| 6,548,891 B2 | 4/2003 | Mashino | |
| 6,551,857 B2 | 4/2003 | Leedy | |
| 6,627,985 B2 | 9/2003 | Huppenthal | |
| 6,633,083 B2 | 10/2003 | Woo | |
| 6,746,936 B1 | 6/2004 | Lee | |
| 6,778,275 B2 | 8/2004 | Bowes | |
| 6,800,930 B2 | 10/2004 | Jackson | |
| 6,812,193 B2 | 11/2004 | Brigham | |
| 6,831,013 B2 | 12/2004 | Tsai | |
| 6,897,148 B2 | 5/2005 | Halahan | |
| 6,924,551 B2 | 8/2005 | Rumer | |
| 6,930,048 B1 | 8/2005 | Li | |
| 7,034,401 B2 | 4/2006 | Savastiouk | |
| 7,052,937 B2 | 5/2006 | Clevenger | |
| 7,075,133 B1 | 7/2006 | Padmanabhan | |
| 7,098,070 B2 | 8/2006 | Chen | |
| 7,111,149 B2 | 9/2006 | Eilert | |
| 7,166,913 B2 | 1/2007 | Chinthakindi | |
| 7,222,420 B2 | 5/2007 | Moriizumi | |
| 7,282,951 B2 | 10/2007 | Huppenthal | |
| 7,323,785 B2 | 1/2008 | Uchiyama | |
| 7,338,896 B2 | 3/2008 | Vanhaelemeersch | |
| 7,381,646 B2 * | 6/2008 | Su et al. | 438/687 |
| 7,402,515 B2 | 7/2008 | Arana | |
| 7,432,592 B2 | 10/2008 | Shi | |
| 7,531,415 B2 | 5/2009 | Kwok | |
| 7,541,677 B2 | 6/2009 | Kawano | |
| 7,564,115 B2 | 7/2009 | Chen | |
| 7,598,607 B2 | 10/2009 | Chung | |
| 7,633,165 B2 * | 12/2009 | Hsu et al. | 257/763 |
| 7,732,926 B2 | 6/2010 | Uchiyama | |
| 7,795,735 B2 | 9/2010 | Hsu | |
| 7,812,426 B2 | 10/2010 | Peng | |
| 7,816,227 B2 | 10/2010 | Chen | |
| 7,825,024 B2 | 11/2010 | Lin | |
| 7,825,517 B2 | 11/2010 | Su | |
| 7,843,064 B2 | 11/2010 | Kuo | |
| 7,846,837 B2 | 12/2010 | Kuo | |
| 7,851,346 B2 | 12/2010 | Lee | |
| 7,928,534 B2 | 4/2011 | Hsu | |
| 7,932,608 B2 | 4/2011 | Tseng | |
| 7,939,941 B2 | 5/2011 | Chiou | |
| 7,955,895 B2 | 6/2011 | Yang | |
| 7,956,442 B2 | 6/2011 | Hsu | |
| 7,969,013 B2 | 6/2011 | Chen | |
| 8,026,592 B2 | 9/2011 | Yoon | |
| 8,034,708 B2 | 10/2011 | Kuo | |
| 8,049,327 B2 | 11/2011 | Kuo | |
| 8,053,898 B2 | 11/2011 | Marcoux | |
| 8,053,900 B2 | 11/2011 | Yu | |
| 8,053,902 B2 | 11/2011 | Chen | |
| 8,063,496 B2 | 11/2011 | Cheon | |
| 8,344,512 B2 | 1/2013 | Knickerbocker | |
| 2001/0038972 A1 | 11/2001 | Lyons | |
| 2002/0005583 A1 * | 1/2002 | Harada et al. | 257/758 |
| 2004/0080041 A1 | 4/2004 | Kimura | |
| 2004/0188817 A1 | 9/2004 | Hua | |
| 2005/0112997 A1 | 5/2005 | Lin | |
| 2005/0136635 A1 | 6/2005 | Savastiouk | |
| 2005/0205991 A1 | 9/2005 | Chen | |
| 2006/0035146 A1 | 2/2006 | Hayashi | |
| 2006/0042834 A1 | 3/2006 | Lee | |
| 2007/0117348 A1 | 5/2007 | Ramanathan | |
| 2007/0126085 A1 | 6/2007 | Kawano | |
| 2007/0190692 A1 | 8/2007 | Erturk | |
| 2008/0073747 A1 | 3/2008 | Chao | |
| 2008/0108193 A1 | 5/2008 | You | |
| 2009/0127667 A1 | 5/2009 | Iwata | |
| 2009/0134498 A1 | 5/2009 | Ikeda | |
| 2009/0180257 A1 | 7/2009 | Park | |
| 2009/0224405 A1 | 9/2009 | Chiou | |
| 2010/0001379 A1 | 1/2010 | Lee | |
| 2010/0140749 A1 | 6/2010 | Kuo | |
| 2010/0140772 A1 | 6/2010 | Lin | |
| 2010/0244247 A1 | 9/2010 | Chang | |
| 2010/0323478 A1 | 12/2010 | Kuo | |

* cited by examiner

INTERPOSER STRUCTURE AND MANUFACTURING METHOD THEREOF

FIELD OF THE INVENTION

The present invention relates to a manufacturing method for an interposer structure, and more particularly to a manufacturing method for an interposer structure by using fewer masks. The present invention also relates to an interposer structure manufactured by the method.

BACKGROUND OF THE INVENTION

Through-Silicon Via "(hereinafter referred to as TSV) is a 3D packaging technology capable of stacking a plurality of chips vertically in a manner like a sandwich. In order to have a higher finesse of chip stack, silicon interposer is accordingly developed.

FIG. 1 is a schematic cross-sectional view of a common silicon interposer structure known in prior art. As shown, a plurality of TSV structures 100 (herein in FIG. 1 is exemplified by two TSV structures 100 only) are formed in a silicon substrate 10, and a dielectric layer 102 and a re-distribution layer (hereinafter referred to as RDL) 101 with specific patterns are formed on one side of the silicon substrate 10. Specifically, the TSV structure 100 is used to provide a via so that the components and/or chips (not shown) disposed on top and bottom of the silicon substrate 10 can have an electrical connection to each other; and the RDL 101 is used to redistribute I/O pads and thereby enabling the related chips to apply in various component modules.

In the related art, however, the formation of the TSV structures 100 in the silicon interposer is realized by using three masks. Specifically, a first mask is used for the formation of a plurality of shallow trenches on a surface of the silicon substrate 10, wherein these shallow trenches will be used as alignment marks for the follow-up manufacturing process. Next, a second mask, aligned with the aforementioned alignment marks, is used to define a plurality of deep trenches of the TSV structures 100. After the deep trenches are formed by performing one or more etching processes, the TSV structures 100 for electrically connecting the components and/or chips disposed on top and bottom of the silicon substrate 10 are formed by performing a metal filling and at least one planarization process to the deep trenches. Then, a dielectric layer is formed on the substrate 10 and a third mask is used to form trenches for the RDL 101. After the trenches for the RDL are formed, a metal filling and at least one planarization process are performed to finish fabricating of the RDL 101. Therefore, at least three masks and multiple metal filling/planarization processes are required for the formation of the TSV structures 100 and the RDL 101 as taught in prior art or conventional related art, and consequentially the conventional interposer structure has a relatively high manufacturing cost.

SUMMARY OF THE INVENTION

Therefore, one object of the present invention is to provide an interposer structure, which has a less complicated manufacturing process and a lower manufacturing cost.

In addition, another object of the present invention is to provide a manufacturing method for the aforementioned interposer structure.

The present invention provides an interposer structure, which includes a semiconductor substrate, a plurality of shallow trenches, a plurality of deep trenches and a plurality of metal damascene structures. The semiconductor substrate has a first surface and a second surface. The shallow trenches are formed on the first surface in both of a first area and a second area of the semiconductor substrate and correspondingly a plurality of respective openings are formed on the first surface, wherein each two adjacent shallow trenches are separated by a portion of the semiconductor substrate. The deep trenches are formed and extending from at least one of the shallow trenches toward the second surface in the second area and correspondingly a plurality of respective openings are formed on the second surface. The metal damascene structures are filled in the shallow trenches and the deep trenches, respectively.

The present invention also provides a manufacturing method for an interposer structure. The manufacturing method includes steps of: providing a semiconductor substrate having a first surface and a second surface opposite to each other; performing, with using a first mask, a first patterning process on the first surface to form a plurality of shallow trenches in both of a first area and a second area of the semiconductor substrate; performing, with using a second mask and using the shallow trenches in the first area as alignment marks, a second patterning process through at least one of the shallow trenches in the second area to form a plurality of deep trenches extending from the at least one shallow trench toward the second surface; and performing a metal filling process and at least one planarization process to form a plurality of metal damascene structures in the shallow trenches and the deep trenches.

In summary, by using fewer masks, the manufacturing method for an interposer structure of the present invention has a less complicated manufacturing process; and correspondingly the interposer structure manufactured by the aforementioned method has lower cost.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
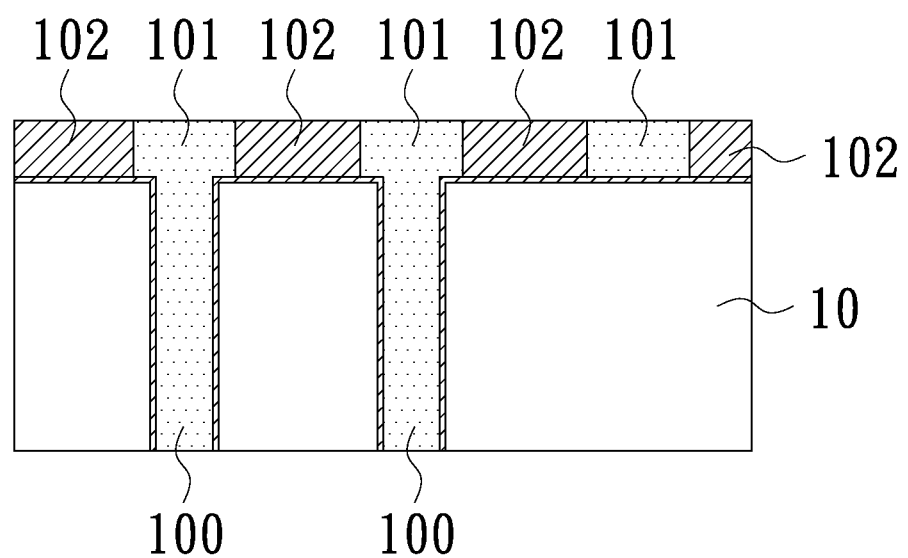
FIG. 1 is a schematic cross-sectional view of a silicon interposer structure in prior art.
Figure 2A:
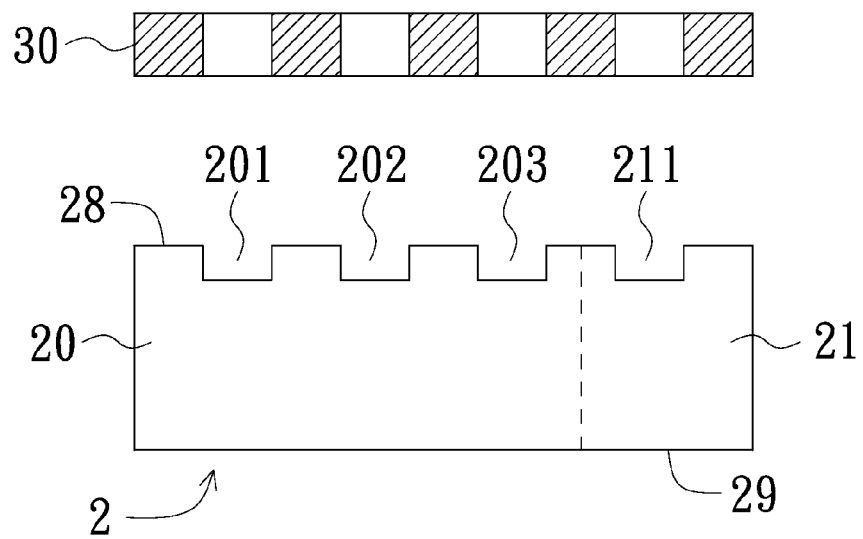
FIGS. 2A~2D are schematic views illustrating a manufacturing process of a silicon interposer structure in accordance with an embodiment of the present invention.

FIGS. 2A~2D are schematic views illustrating a manufacturing process for a silicon interposer structure in accordance with an embodiment of the present invention. First, as shown in FIG. 2A, a substrate 2 having a first surface 28 and a second surface 29 opposite to each other is provided. By defining a first resist pattern (not shown) through performing a first lithography process on the silicon substrate 2 with using a first mask 30 and then performing an etching process with the first defined resist pattern as etching mask, a plurality of shallow trenches (herein the shallow trenches 201, 202, 203 and 211 are exemplified in FIG. 2A) are formed. For illustrative purposes only, the first mask 30 is used with a positive photoresist layer (not shown), but it is not intended to limit the present invention. The first mask 30 includes shaded regions and unshaded regions, and only the latter allow light to pass through. After being exposed to an intense light, exposed portions of the positive photoresist layer corresponding to the unshaded regions are soluble to the developer and removed, while unexposed portions of the positive photoresist layer corresponding to the shaded regions are insoluble to the developer and remained intact to protect portions of the first surface 28 in the follow-up etching process. Therefore, the other portions of the first surface 28 which are not protected by the remaining photoresist layer will be etched through. Accordingly, the shallow trenches 201, 202, 203 and 211 are formed on the silicon substrate 2 and correspondingly the silicon substrate 2 has a respective number of openings formed on the first surface 28 thereof; wherein it is to be noted that each two adjacent shallow trenches 201, 202, 203, 211 in this embodiment are configured be separate portions of the silicon substrate 2. Specifically, the shallow trench 211 located in a scribe-line area 21 is used as a mask alignment mark for the follow-up manufacturing process. The rest of the shallow trenches 201, 202 and 203 are located in a component area 20, and are being used for the RDL in the follow-up manufacturing process. In addition, it is understood that the aforementioned lithography process and etching process together may be referred as a patterning process.

Figure 2B:
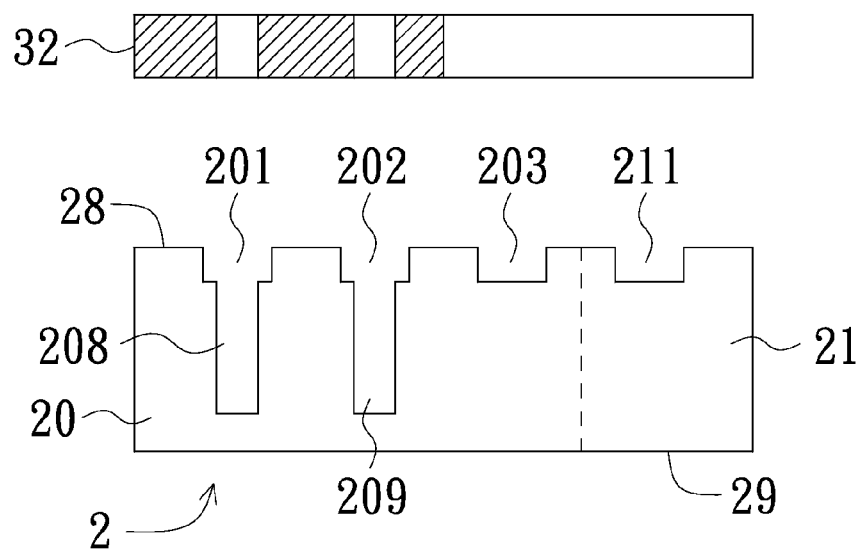

Next, by defining a second resist pattern (not shown) through performing a second lithography process on the silicon substrate 2 with using a second mask 32 and then performing an etching process with the defined second resist pattern and using the shallow trench 211 in the scribe-line area 21 as a mask alignment mark, a plurality of deep trenches (herein the deep trenches 208, 209 are exemplified in FIG. 2B) are formed under some or all of the shallow trenches 201, 202 as illustrated in FIG. 2B. The deep trenches 208, 209 extend from the shallow trenches 201, 202 toward the second surface 29 of the semiconductor substrate 2. The function of the second mask 32 and the related manufacturing processes are similar to that of the first mask 30, and no redundant detail is to be given herein.

Figure 2C:
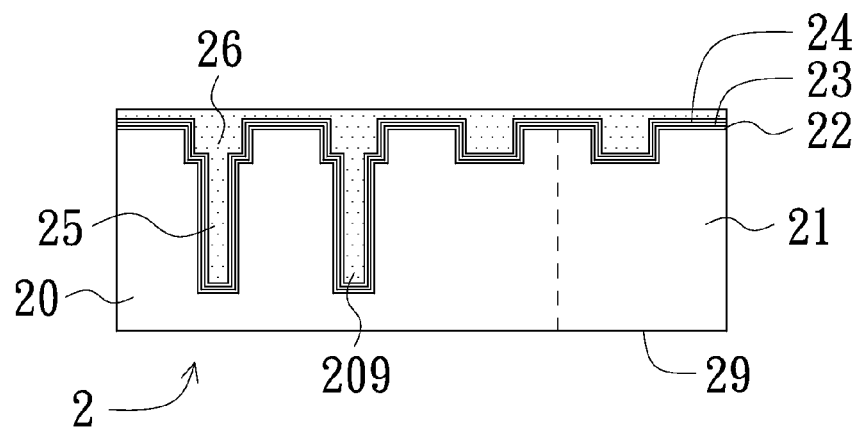

Next, by performing a metal filling process and at least one planarization process for both of the shallow trenches and the deep trenches, a plurality of metal damascene structures for all the aforementioned trenches are formed, respectively. The metal filling process may include the following steps: forming a liner oxide layer 22 in each one of the shallow trenches 201, 202, 203 and the deep trenches 208, 209; forming a barrier layer 23 on a surface of the liner oxide layer 22; forming a seed layer 24 on a surface of the barrier layer 23; and forming a metal layer on a surface of the seed layer 24. Thus, a TSV structure 25 and a respective RDL 26 are formed as illustrated in FIG. 2C. Sometimes, the liner oxide layer 22, the barrier layer 23, the seed layer 24 and the metal layer are also formed in the shallow trench 211 in the scribe-line area 21 along with other trenches. However, the present invention is not limited to this structural configuration, and the stack layers may or may not be formed in the shallow trench 211, which is previously used as a mask alignment mark, according to different applications. In this embodiment, it is understood that the substrate 2 may be other known type of semiconductor substrate; the liner oxide layer 22 may be made of any insulating material such as SiN, SiON, SiC, SiCN, $SiO_2$ or a combination thereof; the material of the barrier layer 23 may be Ti, TiN, Ta, TaN or a combination thereof; the seed layer 24 may be a copper seed layer; and the metal layer for both the TSV structure 25 and the RDL 26 may be made of copper. In addition, the liner oxide layer 22 may be manufactured by thermal oxidation/nitridation method or chemical vapor deposition (CVD) and is used as an isolation layer for both of the TSV structure 25 and the RDL 26.

Figure 2D:
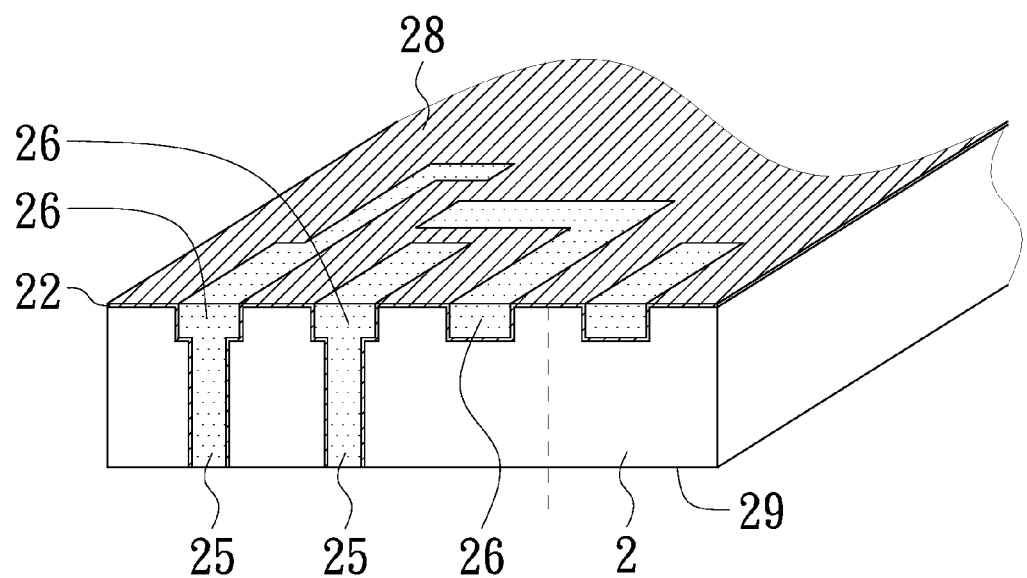

Then, by performing at least one planarization process on the silicon substrate 2 together with the metal layer for both the TSV structure 25 and the respective RDL 26, a silicon interposer structure as illustrated in FIG. 2D is formed. In one embodiment, the planarization process may comprise a chemical-mechanical polishing (CMP) process mainly for polishing the metal (Cu) layer and another CMP process for polishing the barrier layer 23. In another embodiment, the planarization process may only comprise a CMP process mainly for polishing the metal (Cu) layer. Specifically, by performing a planarization on the first surface 28 of the silicon substrate 2, the metal layer filled in the shallow trenches 201, 202 and 203 forms the RDL 26. It is to be noted that the liner oxide layer 22 on the first surface 28 of the silicon substrate 2 may be polished to be completely removed; or, there may be still a portion of the liner oxide layer 22 remaining on the first surface 28 of the silicon substrate 2 for a specific purpose. In addition, by performing at least one thinning or grinding or planarization process on the second surface 29 of the silicon substrate 2, the metal layer filled in the deep trenches 208, 209 forms the TSV structure 25; wherein each one of the TSV structures 25 has a corresponding opening on the second surface 29. Thus, compared with the prior art, the present invention has less patterning processes.

Based on the concept of the present invention, it is understood that the formation of the shallow trenches and the deep trenches may have a reverse order. The deep trenches instead of the shallow trenches may be formed in the scribe-line area and used as the mask alignment marks for the formation of the shallow trenches in the component area. However, because the deep trench has a relatively large depth, it is to be noted that using the shallow trenches as mask alignment marks is a preferred option since more effort is required in the wafer cutting process if the deep trenches are formed in the scribe-line area.

Furthermore, it is understood that another one or more re-distribution layers may be stacked sequentially on a surface of the re-distribution layer 26 if necessary, and no redundant detail is to be given herein.

In summary, by using fewer masks, the manufacturing method for an interposer structure of the present invention has a less complicated manufacturing process; and correspondingly the interposer structure manufactured by the aforementioned method has lower cost.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. An silicon interposer structure, comprising:
   a semiconductor silicon substrate comprising a first surface and a second surface opposite to each other;
   a plurality of shallow trenches formed on the first surface in a first area and a second area of the semiconductor silicon substrate, respectively, and a plurality of respective openings are correspondingly being formed on the first surface, wherein each two adjacent shallow trenches are separated by a portion of the semiconductor silicon substrate;

a plurality of deep trenches formed and extending from at least one of the shallow trenches toward the second surface in the second area of the silicon substrate and a plurality of respective openings being correspondingly formed on the second surface; and a plurality of metal damascene structures filled in the shallow trenches and the deep trenches, wherein the shallow trenches formed in the first area are used as a mask alignment mark for the formation of the deep trenches.

2. The silicon interposer structure according to claim 1, wherein the metal damascene structures filled in the shallow trenches and the deep trenches comprises:

a liner oxide layer formed on a surface of the shallow trenches and the deep trenches;

a barrier layer formed on a surface of the liner oxide layer;

a seed layer formed on a surface of the barrier layer; and a metal layer formed on a surface of the seed layer.

3. The silicon interposer structure according to claim 2, wherein the liner oxide layer is made of an insulating material of SiN, SiON, SiC, SiCN, SiO2 or a combination thereof; the barrier layer is made of Ti, TiN, Ta, TaN or a combination thereof; the seed layer is a copper seed layer; and the metal layer is a copper layer.

4. The silicon interposer structure according to claim 2, wherein the metal damascene structures filled in the shallow trenches in the second area form a re-distribution layer (RDL).

5. The silicon interposer structure according to claim 2, wherein the metal damascene structures filled in the deep trenches form a through-silicon via (TSV) structure.

* * * * *